(12) United States Patent
Kambham

(10) Patent No.: US 11,368,012 B2
(45) Date of Patent: Jun. 21, 2022

(54) PYRO-FUSE CIRCUIT

(71) Applicant: TEXAS INSTRUMENTS INCORPORATED, Dallas, TX (US)

(72) Inventor: Taraka Rama Chandra Reddy Kambham, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/039,237

(22) Filed: Sep. 30, 2020

(65) Prior Publication Data

US 2021/0013708 A1 Jan. 14, 2021

Related U.S. Application Data

(63) Continuation of application No. 16/018,759, filed on Jun. 26, 2018, now Pat. No. 10,833,499.

(60) Provisional application No. 62/576,668, filed on Oct. 25, 2017.

(51) Int. Cl.
| | | |
|---|---|---|
| *H02H 3/08* | (2006.01) | |
| *H02H 1/00* | (2006.01) | |
| *G01R 19/165* | (2006.01) | |
| *G01R 31/00* | (2006.01) | |
| *H03K 5/24* | (2006.01) | |
| *H03K 19/20* | (2006.01) | |

(52) U.S. Cl.
CPC ............. *H02H 3/08* (2013.01); *G01R 19/165* (2013.01); *G01R 31/007* (2013.01); *H02H 1/0007* (2013.01); *H02H 1/0092* (2013.01); *H03K 5/24* (2013.01); *H03K 19/20* (2013.01)

(58) Field of Classification Search
CPC .......... H02H 3/08; H02H 3/087; H02H 3/207; H02H 3/20; H02H 3/32; H02H 3/305; H02H 3/16; H02H 3/105; H02H 1/0015; H02H 1/046; H02H 9/00; H02H 9/04; H02H 9/046; H03K 17/0822; H03K 19/0016; H02J 9/062; H04B 10/80
USPC .................................. 361/93.1–93.9, 60–67
See application file for complete search history.

(56) References Cited

U.S. PATENT DOCUMENTS

| | | | |
|---|---|---|---|
| 4,160,282 | A | 7/1979 | Dolinar |
| 5,629,680 | A | 5/1997 | Surender |
| 2007/0103831 | A1 | 5/2007 | Andrieu |

(Continued)

FOREIGN PATENT DOCUMENTS

RU 2090896 9/1997

OTHER PUBLICATIONS

Supplementary European Search Report in corresponding EP Application No. EP18870032, dated Nov. 13, 2020 (3 pages).

*Primary Examiner* — Bryan R Perez
(74) *Attorney, Agent, or Firm* — John R. Pessetto; Charles A. Brill; Frank D. Cimino

(57) ABSTRACT

Apparatus and method for controlling a pyro-fuse. A pyro-fuse control system includes a current sensing circuit and a diagnostic circuit. The current sensing circuit is configured to determine whether the current flowing in conductor exceeds a threshold current. The diagnostic circuit is coupled to the current sensing circuit. The diagnostic circuit is configured to determine whether an indication of current exceeding the threshold current generated by the current sensing circuit is caused by current flowing the conductor and is not caused by a fault in the current sensing circuit.

9 Claims, 3 Drawing Sheets

(56) References Cited

U.S. PATENT DOCUMENTS

| | | | | |
|---|---|---|---|---|
| 2010/0253373 A1* | 10/2010 | Kawashima | ............ | H02H 7/001 |
| | | | | 324/706 |
| 2011/0307196 A1 | 12/2011 | Schumacher | | |
| 2013/0049721 A1* | 2/2013 | Lo | ............ | G05F 1/575 |
| | | | | 323/280 |
| 2016/0018457 A1* | 1/2016 | Park | ............ | G01R 19/165 |
| | | | | 324/522 |
| 2017/0106825 A1* | 4/2017 | Jousse | ............ | B60R 21/264 |

* cited by examiner

US 11,368,012 B2

PYRO-FUSE CIRCUIT

CROSS-REFERENCE TO RELATED APPLICATIONS

This continuation application claims priority to U.S. patent application Ser. No. 16/018,759, filed Jun. 26, 2018, which claims priority to and the benefit of U.S. Provisional Patent Application No. 62/576,668, filed Oct. 25, 2017, both of which are hereby incorporated herein by reference in their entirety.

BACKGROUND

The batteries used in hybrid and electric vehicles store a large amount of energy. Under various fault conditions, the battery should be electrically isolated from the vehicle's electrical system as quickly as possible to prevent an overcurrent event that can result in a vehicle fire. For example, when a vehicle is involved in a collision, the vehicle's batteries should be disconnected from the electrical system to reduce the possibility of a fire caused by a short circuit. Pyro-fuses are one type of isolation device that is used to quickly disconnect a vehicle's batteries from the vehicle's electrical system.

SUMMARY

An apparatus and method for controlling a pyro-fuse are disclosed herein. In one example, a pyro-fuse control system includes a current sensing circuit and a diagnostic circuit. The current sensing circuit is configured to determine whether the current flowing in a conductor exceeds a threshold current. The diagnostic circuit is coupled to the current sensing circuit. The diagnostic circuit is configured to determine whether an indication of current exceeding the threshold current generated by the current sensing circuit is caused by current flowing the conductor and is not caused by a fault in the current sensing circuit.

In another example, a method for controlling a pyro-fuse includes measuring, by a first isolation amplifier, current flowing in a conductor, and measuring, by a second isolation amplifier, current flowing in an input terminal of the first isolation amplifier. Activation of a pyro-fuse coupled to the conductor is triggered responsive to the current flowing in the conductor exceeding a first threshold current, and the current flowing in the input terminal exceeding a second threshold current.

In a further example, a pyro-fuse circuit includes a first isolation amplifier, a second isolation amplifier, and control circuitry. The first isolation amplifier is configured to transfer, from a first power domain to a second power domain, a signal representing current flow in a conductor. The second isolation amplifier is configured to transfer, from the first power domain to the second power domain, a signal representing current flow in an input terminal of the first isolation amplifier. The control circuitry is configured to activate a pyro-fuse based on an output of the first isolation amplifier indicating that current flow in the conductor exceeds a first current threshold and an output of the second isolation amplifier indicating that current flow in the input terminal of the first isolation amplifier exceeds a second current threshold.

BRIEF DESCRIPTION OF THE DRAWINGS

For a detailed description of various examples, reference will now be made to the accompanying drawings in which.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

A pyro-fuse is also known as pyrotechnic fuse, a pyro-switch, a pyrotechnic switch, etc. A pyro-fuse is a device that is disposed along a conductor, and includes an electrically activated pyrotechnic charge. Activation of the pyrotechnic charge drives a piston, which includes a nonconductive severing member, such as a plastic or ceramic blade, though the conductor, thereby separating the conductor and creating an open circuit in the conductor. While the pyro-fuse should be activated quickly in the event of possible overcurrent event, or an event that could produce a short circuit, when used in a vehicle, activation of the pyro-fuse responsive to an erroneous indication of an overcurrent event effectively disables the vehicle, which is undesirable if the vehicle is in use.

The pyro-fuse circuits disclosed herein include all analog implementations that trigger activation of a pyro-fuse without the delays introduced by use of software-based systems to detect a pyro-fuse triggering condition and activate the pyro-fuse. Implementations of the pyro-fuse control systems also include diagnostic circuitry to verify that overcurrent detection is not caused by an open circuit in current sensing circuitry. The diagnostic circuitry allows a pyro-fuse control circuit to trigger a pyro-fuse only if an overcurrent condition is detected, and the diagnostic circuitry indicates that no open circuits are present in connection of the current measurement circuitry to a shunt resistor. Thus, the pyro-fuse circuits disclosed herein reduce or avoid activation of the pyro-fuse based on false overcurrent detections.

Figure 1:
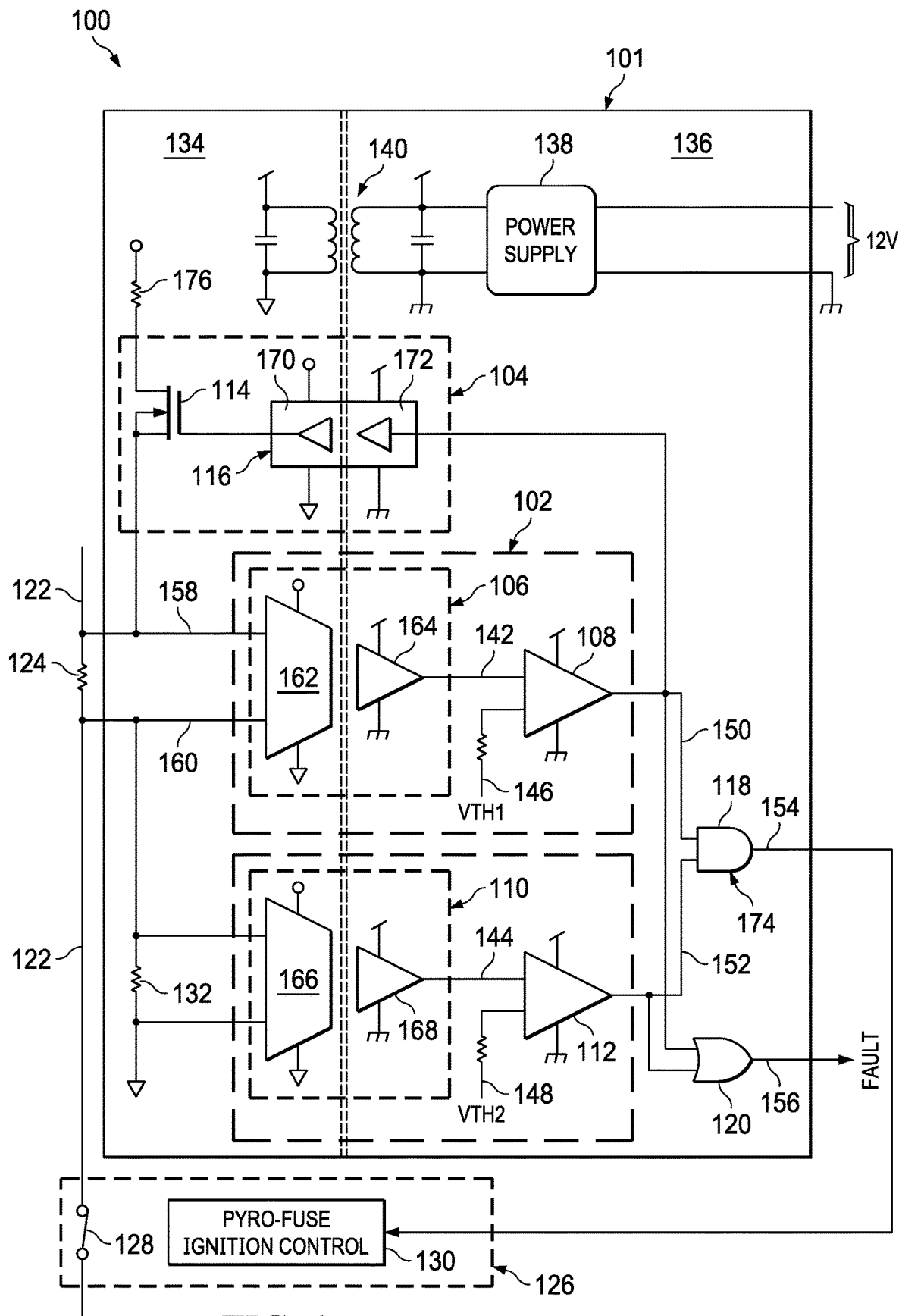
FIG. 1 shows a schematic diagram of a first example of a pyro-fuse circuit in accordance with the present disclosure.

FIG. 1 shows a schematic diagram of a first example of a pyro-fuse circuit 100 in accordance with the present disclosure. The pyro-fuse circuit 100 includes a pyro-fuse control circuit 101, a conductor 122, a shunt resistor 124, and a pyro-fuse 126. The conductor 122 transmits electrical energy from an energy source, such as one or more batteries of a vehicle, to a load circuit, such as the electrical systems of a vehicle. The shunt resistor 124 is a current sensing resistor that is connected in series with conductor 122, and used, by the pyro-fuse control circuit 101, to measure the current flowing in the conductor 122 by measuring the voltage dropped across the shunt resistor 124. The pyro-fuse 126 is coupled to the conductor 122, and includes a piston driven cutting element 128 for severing the conductor 122 and an ignition control circuit 130 that activates a pyrotechnic charge to engage the piston driven cutting element 128 responsive to receipt of a triggering signal 154 provided by the pyro-fuse control circuit 101.

The pyro-fuse control circuit 101 triggers activation of the pyro-fuse 126 responsive to excessive current flow in the conductor 122. For example, if the current flow in the conductor 122 is indicative of a short circuit of the conductor 122 to ground, then the pyro-fuse control circuit 101 triggers activation of the pyro-fuse 126 to sever the conductor 122 and isolate the power source from the load circuit. The pyro-fuse control circuit 101 includes a current sensing circuit 102 and a diagnostic circuit 104 that is coupled to the current sensing circuit 102. The current sensing circuit 102 measures the current flowing in the conductor 122 via the shunt resistor 124, and determines whether the current flowing in the conductor 122 exceeds a threshold. The diagnostic circuit 104 assesses the validity of the measurement performed by the current sensing circuit 102 by testing the paths of current flow to the current sensing circuit 102. That is, the diagnostic circuit 104 determines whether an indication of current exceeding the threshold current generated by the current sensing circuit 102 is caused by current flowing in the conductor (122), or by a fault in the current sensing circuit 102.

The current sensing circuit 102 includes an isolation amplifier 106 and a comparator 108. The circuitry of the pyro-fuse control circuit 101 operates across two power domains (i.e., the power domain 134 and the power domain 136) that may be, for example, be referenced to different ground potentials. The isolation amplifier 106 measures voltage across the shunt resistor 124, and communicates the voltage across the shunt resistor 124 from the power domain 134 to the power domain 136. The isolation amplifier 106 includes an input section 162 (i.e., input circuits) that is disposed in the power domain 134 and an output section 164 (i.e., output circuits) that is disposed in the power domain 136. The isolation amplifier 106 is, for example, an AMC1301 reinforced isolated amplifier produced by TEXAS INSTRUMENTS INC., or other suitable isolation amplifier. The isolation amplifier 106 includes an input terminal 158 that is coupled to the shunt resistor 124 and an input terminal 160 that is coupled to the shunt resistor 124. An output signal 142 generated by the isolation amplifier 106 is provided to the comparator 108.

The comparator 108 is coupled to the isolation amplifier 106 in the power domain 136, and compares the output signal 142 received from the isolation amplifier 106 to a threshold voltage 146. The threshold voltage 146 is representative of a threshold current that corresponds to excessive current flowing in the conductor 122. If the voltage of the output signal 142 exceeds the threshold voltage 146, then the comparator 108 generates an output signal 150 that indicates excessive current is flowing in the conductor 122.

The pyro-fuse 126 may be triggered by on an indication of excessive current flowing in the conductor 122. However, if such an indication is erroneous, then triggering the pyro-fuse 126, which will disable a vehicle, is undesirable. The measurement of current flowing the conductor 122 will be in error if an electrical connection between the isolation amplifier 106 and the conductor 122 is faulty. The diagnostic circuit 104 verifies the electrical connections between the conductor 122 and the isolation amplifier 106 to enable triggering of the pyro-fuse 126 when the current sensing circuit 102 generates an indication of excessive current flow in the conductor 122.

The diagnostic circuit 104 includes an isolator 116, a switch 114, an isolation amplifier 110, and a comparator 112. The isolator 116 is coupled to the comparator 108, and includes input circuitry 172 that is disposed in the power domain 136 and output circuitry 170 that is disposed in the power domain 134. The isolator 116 communicates the output signal 150 generated by the comparator 108 from the power domain 136 to the power domain 134. In some implementations of the pyro-fuse control circuit 101, the isolator 116 is implemented using an ISO7710 by TEXAS INSTRUMENTS INC., or other suitable isolator circuit.

The isolator 116 is coupled to the switch 114 (i.e., to a control input of the switch 114). The switch 114 is implemented using an N-channel metal oxide semiconductor field effect transistor (MOSFET) in some implementations of the pyro-fuse control circuit 101. The output signal 150 is propagated through the isolator 116 and closes the switch 114 to allow current to flow through the switch 114 to the input terminal 158 of the isolation amplifier 106, through the shunt resistor 124 to the input terminal 160 of the isolation amplifier 106, and through the resistor 132 to the ground in the power domain 134. The current flowing through the switch 114 is set by the resistor 176. The isolation amplifier 110 is coupled to the input terminal 160 of the isolation amplifier 106. The isolation amplifier 110 measures the voltage dropped across the resistor 132 as a measure of the current flowing in the input terminal 158, the shunt resistor 124, and the input terminal 160 by way of the switch 114. The isolation amplifier 110 communicates the voltage across the resistor 132 from the power domain 134 to the power domain 136. The isolation amplifier 110 includes an input section 166 (i.e., input circuits) that is disposed in the power domain 134 and an output section 168 (i.e., output circuits) that is disposed in the power domain 136. The isolation amplifier 110 is, for example, an AMC1311 reinforced isolated amplifier produced by TEXAS INSTRUMENTS INC., or other suitable isolation amplifier. An output signal 144 generated by the isolation amplifier 110 is provided to the comparator 112.

The comparator 112 is coupled to the isolation amplifier 110 in the power domain 136, and the compares the output signal 144 received from the isolation amplifier 110 to a threshold voltage 148. The threshold voltage 148 is representative of current flow in the input terminal 160 of the isolation amplifier 106 that indicates intact electrical connections between the isolation amplifier 106 and the conductor 122. If the voltage of the output signal 144 exceeds the threshold voltage 148, then the comparator 112 generates an output signal 152 that indicates electrical connection of the isolation amplifier 106 to the conductor 122.

The pyro-fuse control circuit 101 includes control circuitry 174 that triggers the pyro-fuse 126 based on the output signal 150 generated by the comparator 108 and the output signal 152 generated by the comparator 112. In the pyro-fuse control circuit 101, the control circuitry 174 includes a logic gate (i.e., an AND gate) 118 that generates a triggering signal 154 to trigger activation of the pyro-fuse 126 if the output signal 150 indicates that excessive current is flowing in the conductor 122 and the output signal 152 indicates that the isolation amplifier 106 is electrically connected to the conductor 122. The logic gate 118 is coupled to the pyro-fuse 126.

Some implementations of pyro-fuse control circuit 101 provide the output signal 150 and the output signal 152 to circuits external to the pyro-fuse control circuit 101 for use in evaluating the status of the pyro-fuse circuit 100. Some implementations of the pyro-fuse control circuit 101 include a logic gate (i.e., an OR gate) 120 that asserts an output signal 156 if either of the output signal 150 or the output signal 152 is a logic one. Thus, the output signal 156 is a fault indicator signifying that excessive current has been detected or a fault in the pyro-fuse circuit 100 has been detected. For example, if the output signal 156 is active and the output signal 150 and the output signal 152 are active, then excessive current flow in the conductor 122 has been detected. If the output signal 156 is active, the output signal 150 is active, and the output signal 152 is inactive, then there is a fault in the electrical connection of the isolation amplifier 106 to the conductor 122 that should be corrected.

The pyro-fuse control circuit 101 also includes a power supply 138 that generates power supply voltages for use by the control circuitry 174 of the isolator 116, the input section 162 of the isolation amplifier 106, and the input section 166 of the isolation amplifier 110. Power signals are transmitted from the power domain 136 to the power domain 134 via a transformer 140.

The pyro-circuit 100 provides a dedicated hardware pyro-fuse control circuit implementation that avoids software related issues, such as execution latency that delays triggering of the pyro-fuse 126, and software execution errors.

Figure 2:
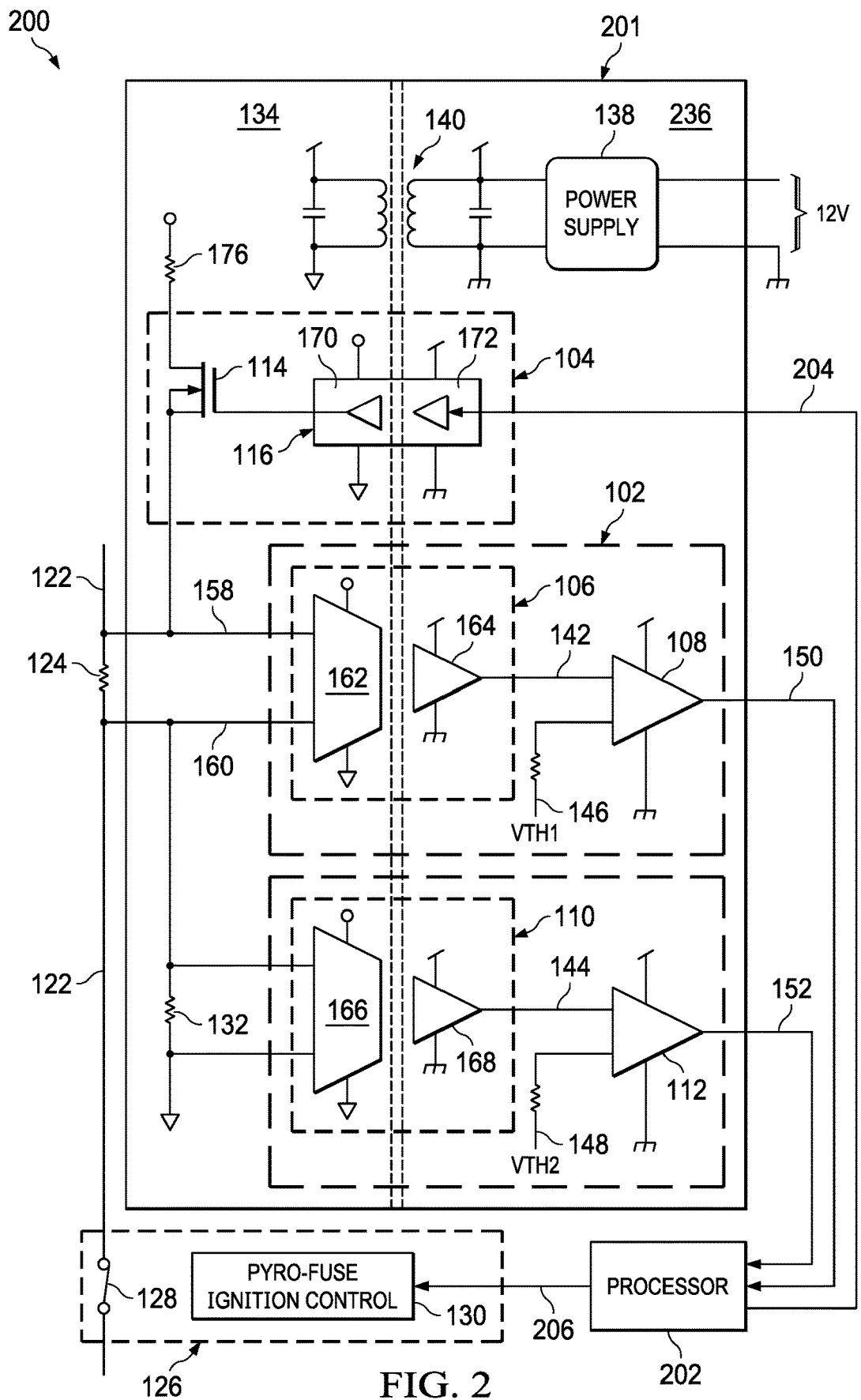
FIG. 2 shows a schematic diagram of a second example of a pyro-fuse circuit in accordance with the present disclosure.

FIG. 2 shows a schematic diagram of a second example of a pyro-fuse circuit 200 in accordance with the present disclosure. The pyro-fuse circuit 200 includes a pyro-fuse control circuit 201, a conductor 122, a shunt resistor 124, a pyro-fuse 126, and processor 202. The conductor 122 transmits electrical energy from an energy source, such as one or more batteries of a vehicle, to a load circuit, such as the electrical systems of a vehicle. The shunt resistor 124 is a resistor used, by the pyro-fuse control circuit 201, to measure the current flowing in the conductor 122 by measuring the voltage dropped across the shunt resistor 124. The pyro-fuse 126 includes a piston driven cutting element 128 for severing the conductor 122 and an ignition control circuit 130 that activates a pyrotechnic charge to engage the 128 responsive to receipt of a triggering signal 154 provided by the pyro-fuse control circuit 201.

The pyro-fuse control circuit 201 triggers activation of the pyro-fuse 126 responsive to excessive current flow in the conductor 122. For example, if the current flow in the conductor 122 is indicative of a short circuit of the conductor 122 to ground, then the pyro-fuse control circuit 201 triggers activation of the pyro-fuse 126 to isolate the power source from the load circuit. The pyro-fuse control circuit 201 includes a current sensing circuit 102 and a diagnostic circuit 104. The current sensing circuit 102 measures the current flowing in the conductor 122 via the shunt resistor 124. The diagnostic circuit 104 assesses the validity of the measurement performed by the current sensing circuit 102 by testing the paths of current flow to the current sensing circuit 102.

The current sensing circuit 102 includes an isolation amplifier 106 and a comparator 108. The circuitry of the pyro-fuse control circuit 201 operates across two power domains (i.e., the power domain 134 and the power domain 134) that are, for example, referenced to different ground potentials. The isolation amplifier 106 communicates the voltage across the shunt resistor 124 from the power domain 134 to the power domain 236. The isolation amplifier 106 includes an input section 162 that is disposed in the power domain 134 and an output section 164 that is disposed in the power domain 236. The isolation amplifier 106 is, for example, an AMC1301 reinforced isolated amplifier produced by TEXAS INSTRUMENTS INC., or other suitable isolation amplifier. The isolation amplifier 106 includes an input terminal 158 that is coupled to the shunt resistor 124 and an input terminal 160 that is coupled to the shunt resistor 124. An output signal 142 generated by the isolation amplifier 106 is provided to the comparator 108.

The comparator 108 is coupled to the isolation amplifier 106, and compares the output signal 142 received from the isolation amplifier 106 to a threshold voltage 146. The threshold voltage 146 is representative of a threshold current that corresponds to excessive current flowing in the conductor 122. If the voltage of the output signal 142 exceeds the threshold voltage 146, then the comparator 108 generates an output signal 150 that indicates excessive current is flowing in the conductor 122.

The output signal 150 is provided to the processor 202. The processor 202 may be a microcontroller, a general-purpose microprocessor, or other device that executes instructions retrieved from a computer-readable medium to provide logical, arithmetic, and/or data transfer functionality. In various implementations of the pyro-fuse circuit 200, the processor 202 may be included in the pyro-fuse control circuit 201, or provided external to the pyro-fuse control circuit 201.

The processor 202 is coupled to the pyro-fuse 126, and may trigger the pyro-fuse 126 based on an indication of excessive current flowing in the conductor 122. However, if such an indication is erroneous, then triggering the pyro-fuse 126, which will disable a vehicle, is undesirable. The measurement of current flowing the conductor 122 will be in error if an electrical connection between the isolation amplifier 106 and the conductor 122 is faulty. The diagnostic circuit 104 verifies the electrical connections between the conductor 122 and the isolation amplifier 106 to enable triggering of the pyro-fuse 126 when the current sensing circuit 102 generates an indication of excessive current flow in the conductor 122.

The diagnostic circuit 104 includes an isolator 116, a switch 114, an isolation amplifier 110, and a comparator 112. The isolator 116 is coupled to the processor 202, and includes input circuitry 172 that is disposed in the power domain 236 and output circuitry 170 that is disposed in the power domain 134. When the processor 202 receives the output signal 150, the processor 202 activates the signal 204 to initiate diagnostic testing of the electrical connections between the isolation amplifier 106 and the conductor 122. The isolator 116 communicates the signal 204 generated by the processor 202 from the power domain 236 to the power domain 134. In some implementations of the pyro-fuse control circuit 201, the isolator 116 is implemented using an ISO7710 by TEXAS INSTRUMENTS INC., or other suitable isolator circuit.

The isolator 116 is coupled to the switch 114 in the power domain 134. The switch 114 is implemented using an N-channel MOSFET in some implementations of the pyro-fuse control circuit 201. The signal 204 propagates through the isolator 116 and closes the switch 114 to allow current to flow through the switch 114 to the input terminal 158 of the isolation amplifier 106, through the shunt resistor 124 to the input terminal 160 of the isolation amplifier 106, and through the resistor 132 to the ground in the power domain 134. The current flowing through the switch 114 is set by the resistor 176. The isolation amplifier 110 is coupled to the input terminal 160 of the isolation amplifier 106. The isolation amplifier 110 measures the voltage dropped across the resistor 132 as a measure of the current flowing in the input terminal 158, the shunt resistor 124, and the input terminal 160 by way of the switch 114. The isolation amplifier 110 communicates the voltage across the resistor 132 from the power domain 134 to the power domain 236. The isolation amplifier 110 includes an input section 166 that is disposed in the power domain 134 and an output section 168 that is disposed in the power domain 236. The isolation amplifier 110 is, for example, an AMC1311 reinforced isolated amplifier produced by TEXAS INSTRUMENTS INC., or other suitable isolation amplifier. An output signal 144 generated by the isolation amplifier 110 is provided to the comparator 112.

The comparator 112 is coupled to the isolation amplifier 110, and compares the output signal 144 received from the isolation amplifier 110 to a threshold voltage 148. The threshold voltage 148 is representative of a current flow in the input terminal 160 of the isolation amplifier 106 that indicates intact electrical connections between the isolation amplifier 106 and the conductor 122. If the voltage of the output signal 144 exceeds the threshold voltage 148, then the comparator 112 generates an output signal 152 that indicates electrical connection of the isolation amplifier 106 to the conductor 122. The comparator 112 is coupled to the processor 202, and the output signal 152 is provided to the processor 202.

In the pyro-fuse control circuit 201, the functionality of the control circuitry 174 of the pyro-fuse control circuit 101 is provided by the processor 202. The processor 202 triggers the pyro-fuse 126 based on the output signal 150 generated by the comparator 108 and the output signal 152 generated by the comparator 112. The processor 202 is coupled to the pyro-fuse 126, and generates a signal 206 to trigger activation of the pyro-fuse 126 if the output signal 150 indicates that excessive current is flowing in the conductor 122 and the output signal 152 indicates that the isolation amplifier 106 is electrically connected to the conductor 122.

The processor 202 monitors the output signal 150 and the output signal 152 to evaluate the status of the pyro-fuse circuit 200. For example, if the output signal 150 and the output signal 152 are active, then excessive current flow in the conductor 122 has been detected. If the output signal 150 is active, and the output signal 152 is inactive, then there is a fault in the electrical connection of the isolation amplifier 106 to the conductor 122 that should be corrected.

The pyro-fuse control circuit 201 also includes a power supply 138 that generates power supply voltages for use by the output circuitry 170 of the isolator 116, the input section 162 of the isolation amplifier 106, and the input section 166 of the isolation amplifier 110. Power signals are transmitted from the power domain 236 to the power domain 134 via a transformer 140.

Figure 3:
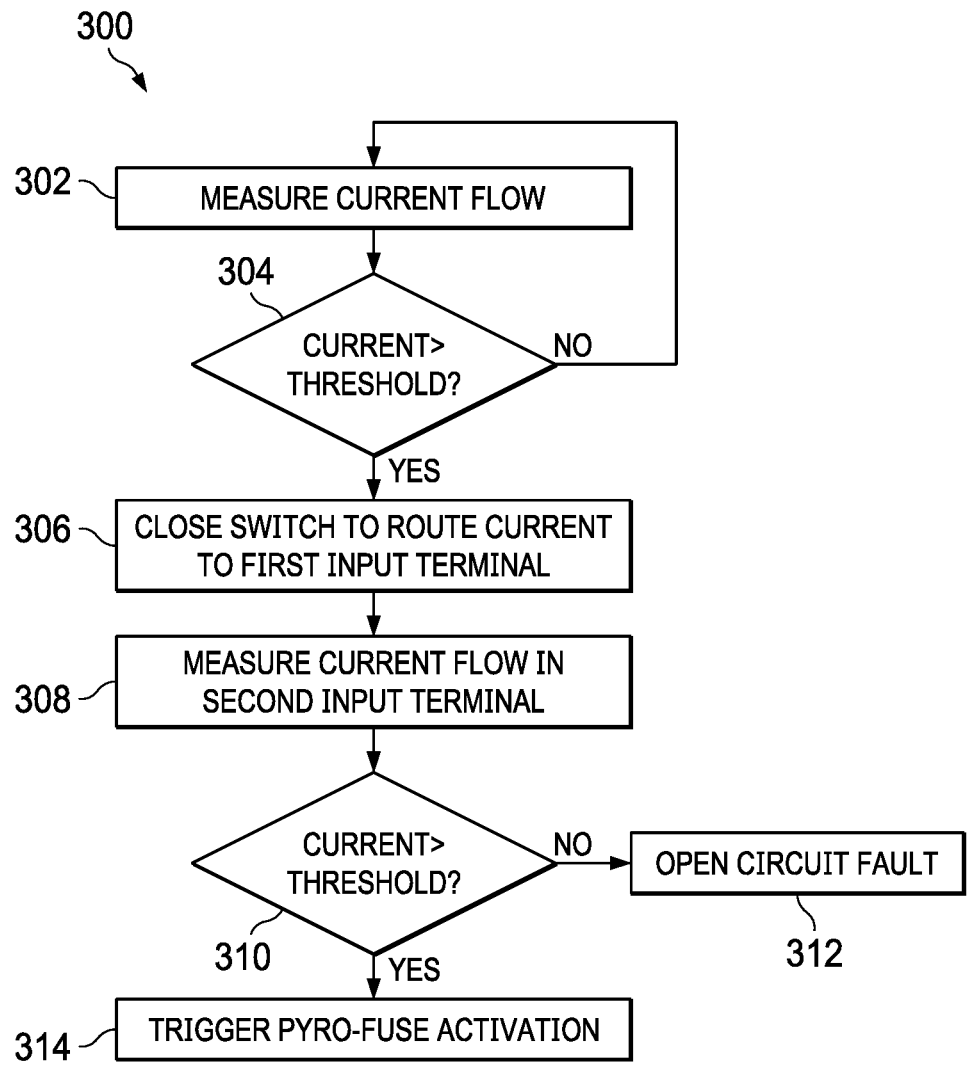
FIG. 3 shows a flow diagram for a method for controlling a pyro-fuse in accordance with present disclosure.

FIG. 3 shows a flow diagram for a method 300 for controlling a pyro-fuse 126 in accordance with present disclosure. Though depicted sequentially as a matter of convenience, at least some of the actions shown can be performed in a different order and/or performed in parallel. Additionally, some implementations may perform only some of the actions shown.

In block 302, current is flowing in the conductor 122 and the current sensing circuit 102 is measuring the current flow in the conductor 122 via the voltage drop across the shunt resistor 124.

The comparator 108 is comparing the output signal 142 of the isolation amplifier 106 to a threshold voltage 146 that is representative of threshold current indicative of excessive current flow in the conductor 122. If, in block 304, the current flowing in the conductor 122 exceeds the threshold current, as shown by the output signal 142 exceeding the threshold voltage 146, then, the diagnostic circuit 104 is activated to test the electrical connection of the isolation amplifier 106 to the conductor 122.

To test the electrical connection of the isolation amplifier 106 to the conductor 122, in block 306, the switch 114 is closed to switch a current onto the input terminal 158 of the isolation amplifier 106. Closing of the switch 114 is controlled by the processor 202 or the comparator 108, via the isolator 116, in various implementations. If the input terminal 158 and the input terminal 160 of the isolation amplifier 106 are electrically connected to the conductor 122, then the current enabled by closing the switch 114 flows through the shunt resistor 124 to the input terminal 160, and through the resistor 132.

In block 308, the diagnostic circuit 104 measures the current flowing in the input terminal 160 via the voltage drop across the resistor 132.

The comparator 112 is comparing the output signal 144 of the isolation amplifier 110 to a threshold voltage 148 that is representative of threshold current indicative of an electrical connection of the input terminal 158 and the input terminal 160 to the conductor 122. If, in block 310, the current flowing in the input terminal 160 exceeds the threshold current, as shown by the output signal 144 exceeding the threshold voltage 148, then, in block 314, activation of the pyro-fuse 126 is triggered. Triggering of the pyro-fuse 126 is controlled by the processor 202 or the logic gate 118 in various implementations.

If, in block 310, the current flowing in the input terminal 160 of the isolation amplifier 110 does not exceed the threshold current, then the detection of excess current flowing in the conductor 122 of block 304 may be due an open circuit fault (i.e., an open circuit in the electrical connection between the isolation amplifier 106 and the conductor 122) and the triggering of the pyro-fuse 126 is inhibited by the logic gate 118 or the processor 202. A fault indication may be generated responsive to the comparison of block 304 and/or the comparison block 310 indicating that a threshold has been exceeded.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method for controlling a pyro-fuse, comprising: measuring, by a first isolation amplifier, a first current flowing from a first input of the first isolation amplifier to a second input of the first isolation amplifier; measuring, by a second isolation amplifier, a second current flowing from a first input terminal of the second isolation amplifier to a second input of the second isolation amplifier; and triggering activation of a pyro-fuse coupled to the second input of the first isolation amplifier responsive to the first current exceeding a first threshold current, and the second current exceeding a second threshold current; comparing, by a comparator, an output signal generated by the first isolation amplifier to a voltage representing the first threshold current; comprising closing a switch coupled to the first input of the first isolation amplifier to enable a third current to flow from the switch to the first input terminal of the first isolation amplifier responsive to the first current exceeding the first threshold current.

2. The method of claim 1, further comprising generating a fault indication responsive to the first current exceeding the first threshold current, or the second current exceeding the second threshold current.

3. The method of claim 1, further comprising comparing, by a comparator, an output signal generated by the second isolation amplifier to a voltage representing the second threshold current.

4. The method of claim 1, further comprising inhibiting activation of the pyro-fuse based on the second current being less than the second threshold current.

5. A pyro-fuse circuit comprising:
- a first isolation amplifier having a first input and a second input, configured to transfer, from a first power domain to a second power domain, a signal representing a first current from the first input to the second input of the first isolation amplifier;
- a second isolation amplifier configured having a first input and a second input to transfer, from the first power domain to the second power domain, a signal representing a second current from the first input to the second input of the second isolation amplifier;
- control circuitry configured to activate a pyro-fuse based on an output signal generated by the first isolation amplifier representing the first current that exceeds a first current threshold and an output signal generated by the second isolation amplifier representing the second current that exceeds a second current threshold.

6. The pyro-fuse circuit of claim 5, further comprising control circuitry configured to trigger a pyro-fuse based on a output of a first comparator indicating that the first current exceeds a first threshold current and a output of a second comparator indicating that the second current exceeds a second threshold current.

7. The pyro-fuse circuit of claim 6, further comprising a fault indicator configured to indicate a fault condition based on the output generated by the first comparator indicating that the first current exceeds the first threshold current or the output generated by the second comparator indicating that the second current exceeds the second threshold current.

8. The pyro-fuse circuit of claim 5, further comprising control circuitry that includes a processor coupled to a first comparator, a second comparator, and a switch, wherein the processor is configured to:
- control the switch based an output signal generated by the first comparator; and
- control the pyro-fuse based on the output signal generated by the first comparator and an output signal generated by the second comparator.

9. The pyro-fuse circuit of claim 8, further comprising an AND gate coupled to the first comparator and the second comparator, the AND gate configured to trigger the pyro-fuse based on an output signal generated by the first comparator and an output signal generated by the second comparator.

* * * * *